(12) United States Patent
Lambert et al.

(10) Patent No.: US 8,573,989 B2
(45) Date of Patent: Nov. 5, 2013

(54) MEMORY CARD READER

(75) Inventors: Xavier Lambert, Rueil Malmaison (FR); Sylvain De Sa Costa, Valence (FR); Lilian Vassy, Albon (FR)

(73) Assignee: Compagnie Industrielle et Financiere d'Ingenierie "Ingenico", Neuilly sur Seine (FR)

( * ) Notice: Subject to any disclaimer, the term of this patent is extended or adjusted under 35 U.S.C. 154(b) by 246 days.

(21) Appl. No.: 12/760,968

(22) Filed: Apr. 15, 2010

(65) Prior Publication Data

US 2010/0265681 A1    Oct. 21, 2010

(30) Foreign Application Priority Data

Apr. 15, 2009    (FR) .................................... 09 52476

(51) Int. Cl.
*H01R 13/44*    (2006.01)

(52) U.S. Cl.
USPC ......................................................... 439/135

(58) Field of Classification Search
USPC ........... 439/135, 95, 108, 152, 329, 630–631, 439/567, 260
See application file for complete search history.

(56) References Cited

U.S. PATENT DOCUMENTS

| | | | | |
|---|---|---|---|---|
| 5,775,949 | A * | 7/1998 | Bricaud et al. | 439/630 |
| 6,447,338 | B1 * | 9/2002 | Bricaud et al. | 439/630 |
| 6,899,565 | B2 * | 5/2005 | Kodera et al. | 439/607.22 |
| 7,074,059 | B2 * | 7/2006 | Valcher et al. | 439/95 |
| 2003/0022537 | A1 * | 1/2003 | Bricaud et al. | 439/152 |
| 2005/0124222 | A1 * | 6/2005 | Fan | 439/630 |
| 2006/0040558 | A1 * | 2/2006 | Ho | 439/607 |
| 2008/0156521 | A1 | 7/2008 | Karasawa et al. | |

FOREIGN PATENT DOCUMENTS

| | | |
|---|---|---|
| EP | 0256778 A2 | 2/1988 |
| FR | 2875036 A1 | 3/2010 |

OTHER PUBLICATIONS

French Search Report dated Dec. 8, 2009 for corresponding French Application No. 0952476 filed Apr. 15, 2009.

* cited by examiner

*Primary Examiner* — Jean F Duverne
(74) *Attorney, Agent, or Firm* — David D. Brush; Westman, Champlin & Koehler, P.A.

(57) ABSTRACT

A memory card reader is provided, which includes a printed circuit on which a memory card connector is mounted. The memory card connector has a slot intended for inserting a memory card and a set of contact points enabling data exchange between the memory card and a processor mounted on the printed circuit. The printed circuit is further equipped with an anti-intrusion device formed and positioned such that the anti-intrusion device prevents access, from the exterior of the reader, to at least one connection portion between at least one of the contact points of the set of contact points and the printed circuit.

7 Claims, 3 Drawing Sheets

MEMORY CARD READER

FIELD OF THE DISCLOSURE

This disclosure relates to the field of protecting memory card-reading devices. Such memory card-reading devices are used in numerous apparatuses such as payment terminals, authentication or identification devices or content-reading devices.

This disclosure relates more particularly to the securing of such memory card-reading devices so that it is impossible to capture or to monitor signals which are exchanged between a memory card inserted into the device and a secure processor which processes the data derived from this memory card.

BACKGROUND OF THE DISCLOSURE

Devices which incorporate memory card-reading devices, such as payment terminals, include numerous securement devices and implement numerous methods which make it possible to ensure that the apparatuses are used in accordance with the uses for which they were intended and that they comply with the security standards imposed by certification organizations.

For example, in the field of payment terminals for smart cards, manufacturers have been required to comply with the PCI PED 2.0 standard (Payment Card Industry PIN Entry Device) since Jan. 1, 2008.

This new security standard consists, in particular, in securing the entry keypad of the terminals by protecting the inputting of the PIN code, and in locking the terminal in the event of an intrusion (fraudulent or accidental).

A payment terminal is shown in connection with FIG. 1. In terms of its construction, such a payment terminal 10 generally has:
- a keypad 11 on the upper face thereof;
- a memory card connector 12, which is sometimes positioned underneath the keypad, and which enables the card to be inserted and to interact with same. This memory card connector 12 is attached to a printed circuit 13, generally by means of welds.

In order to protect the terminal, it has sometimes been deemed advantageous to combine the security features on these two components. A first protective device consists in applying a protective mesh circuit for the memory card connector around the memory card connector and in electrically connecting this grating circuit to the electronic board by means of welds, which are not accessible without removing the keypad. Such being the case, the keypad is itself protected from being fraudulently disassembled by the presence of dummy keys which detect the removal of the keyboard. For this reason, a simple protective device (e.g., with a mesh circuit on a single face of a flexible printed circuit), may be sufficient for protecting four faces out of five of the memory card (MC) connector.

The last face used for inserting the customer card cannot be closed, of course. Therefore, in this specific case, an angle of attack remains to the fraudor for reaching the connector points of contact (PINS), and particularly the points of contact through which the input/output (I/O) signals travel.

Indeed, by way of its layout on the printed circuit, the memory card connector defines three regions:
- a main connector area with the memory card, which enables the information present on the card to be read;
- a connecting region which is embedded into the memory card connector;
- an intermediate region wherein the contact points are connected to the printed circuit.

It was necessary to take protective measures against fraudulent access to these contact points. Indeed, it is possible to anticipate a connection of a monitoring device with regard to these contact points, which could be used to record the signals travelling between the processor and the smart card. Such recording could result in the obtainment of sensitive data. These contact points must therefore be protected at the intermediate region level, by a system which does not interfere with the functionality of the memory card connector.

Such securement is achieved using several hardware and software technologies.

On the hardware level, some manufacturers have built a cover directly on the memory card connector. According to the manufacturers, this cover is fixed or removable. When removable, this cover is mounted pivotably in order to enable maintenance of the apparatus, although it places same out of service (the pivot enables to be "sensitive" in order to trigger a securement procedure when access thereto is desired). The apparatus remains repairable by an authorized individual (but cause a loss of the sensitive information, such as the banking information). However, this is an expensive solution which requires an activation operation. When this cover is mounted fixedly onto the memory card connector, or when it forms an integral part of the memory card connector, it is generally not possible to interfere with the memory card connector in order to perform maintenance on the apparatus. It is thus necessary to replace the entire memory card connector. In addition, these connectors require an additional step in order to activate the protective feature (mechanical operation).

Additionally, in the solutions of the prior art, the covers generally consist of a part made of plastic or a heavy-duty material and a conductive element such as a copper wire. The manufacture of such a cover, by integrating both non-conductive elements and conductive elements, which does not measure more than a few millimeters, is complex.

It was thus necessary to find a simple and inexpensive protection solution which enables maintenance to be performed on the apparatus without rendering the apparatus unserviceable.

SUMMARY

An aspect of the disclosure relates to a memory card reader comprising a printed circuit on which a memory card connector is mounted, said memory card connector having a slot intended for inserting a memory card and a set of contact points enabling data exchange between said memory card and a processor mounted on said printed circuit.

According to an exemplary embodiment of the disclosure, said printed circuit is further equipped with an anti-intrusion device formed and positioned such that said anti-intrusion device prevents access, from the exterior of said reader, to at least one connection portion between at least one of said contact points of said set of contact points and said printed circuit.

In this way, it is impossible to access the PINS of the connector in order to fraudulently obtain the signals travelling between the memory card and the processor. Indeed, whereas the devices of the prior art proposed solutions consisting in masking the PINS directly at the memory card connector level, e.g., by proposing a plastic cover, an embodiment of the disclosure proposes a solution based on directly attaching to the printed circuit an anti-intrusion device which is specifically designed to function as a cover for the points of contact of the memory card connector. An embodiment of the disclosure thus provides an easy-to-implement and inexpensive solution since it suffices to mount and attach the anti-intrusion device at the appropriate location. This operation can even be carried out after the memory card connector has been mounted, e.g., by using a method for transferring components onto circuits printed by means of a lead-free process.

According to one particular embodiment of the disclosure, said anti-intrusion device is substantially in the shape of a rectangular parallelepiped comprising, on the upper face thereof, a protuberance obstructing access to said contact points via the upper part of said anti-intrusion device. According to an embodiment of the disclosure, the anti-intrusion device is made according to printed circuit manufacturing techniques.

According to one particular embodiment of the disclosure, said anti-intrusion device includes at least one three-dimensional conducting circuit and at least two contact elements of said conducting circuit with a connector area of said anti-intrusion device on said printed circuit.

In this way, the anti-intrusion device is tamperproof, because a security breach thereof results in a short circuit in the grating that it includes, thereby triggering action by the secure processor.

According to one particular embodiment of the disclosure, said printed circuit includes a region intended to receive said anti-intrusion device, which includes an even number of connector areas of said anti-intrusion device.

In this way, during a micro-attachment operation, such as soldering, of said anti-intrusion device onto said printed circuit, the wetting forces are exerted uniformly between said anti-intrusion device and said printed circuit, whereby said SMC does not undergo any floating (movement, displacement) during the attachment operation.

According to one particular feature of the disclosure, said areas consist of at least two separate portions, while, during the attachment of said anti-intrusion device onto said printed circuit, a space enables air resulting from said attachment to be discharged.

An embodiment of the disclosure likewise relates to a PIN code input device.

According to an embodiment of the disclosure, such a device includes a memory card reader as described above.

The disclosure also relates to an anti-intrusion device, in particular for a memory card reader. According to an illustrative embodiment of the disclosure, such a device includes several superimposed layers of printed circuit which are interconnected by means of embedded vias, and in that it is in the form of an electronic component capable of being electrically connected to a printed circuit on which it is mounted.

According to another aspect, the disclosure relates to a method of securing an electronic component mounted on a printed circuit. According to an illustrative embodiment, such a method includes a step of installing, simultaneously with said electronic component being secured, an anti-intrusion device comprising several superimposed layers of printed circuit interconnected by means of embedded vias, which is capable of being electrically connected to a printed circuit on which it is mounted.

BRIEF DESCRIPTION OF THE DRAWINGS

Other features and advantages will become more apparent upon reading the following description of an embodiment, given for merely illustrative and non-limiting purposes, and from the appended drawings, in which.

DETAILED DESCRIPTION OF ILLUSTRATIVE EMBODIMENTS

1. Principle of an Exemplary Aspect of the Disclosure

An exemplary aspect of the disclosure proposes to provide front-end protection for the contact points of the memory card connector by attaching an anti-intrusion device to the printed circuit. Since the anti-intrusion device is mounted on the printed circuit, and not on the memory card connector, it is simpler to mount. Additionally, it is easier to manufacture an anti-intrusion device which is mounted directly on the printed circuit than to manufacture an anti-intrusion device which must be built into the memory card connector itself.

According to the an example, the anti-intrusion device is a surface-mounted electronic component (SMC). The anti-intrusion device can thus be mounted on the printed circuit at the same time as the other components, during the same manufacturing phase as the other components (the order installation being defined when the apparatus is designed).

In one embodiment, the anti-intrusion device is capable of being shaped so as to receive therewithin an electronic circuit to be protected, thereby forming a protective enclosure inside of which can be found a sensitive electronic circuit that one wishes to protect. In this way, the anti-intrusion device can be used not only for protecting contact points, such as input/output contact points, but also printed circuits in their entirety, thereby preventing any attempt at monitoring, e.g., a processor located within the device.

Indeed, according to an exemplary aspect of the disclosure, the anti-intrusion device includes several superimposed layers of printed circuit which are interconnected by means of embedded vias and in that it is in the form of an electronic component. Such a device can be in any shape. The shape of the device can be customized to the component or printed circuit being protected.

According to an example, protection of an electronic component mounted on a printed circuit is achieved by carrying out an installation step simultaneously with said electronic component being secured. When the anti-intrusion device forms a protective enclosure, this simultaneous installation step ensures that it is not possible to tamper with the electronic component being secured.

An exemplary embodiment of a memory card reader device is introduced hereinbelow. However, it is clear that aspect of the disclosure are not limited to this particular application, but can likewise be implemented in numerous other contexts of protecting electronic circuits, and more generally in any case wherein the features listed below are advantageous.

2. Description of an Embodiment

In this embodiment, a memory card reader according to an example of the disclosure is introduced, wherein an anti-intrusion device is mounted on the printed circuit so as to prohibit access to the points of contact, including the so-called "IO" (input/output) contact points.

Figure 1:
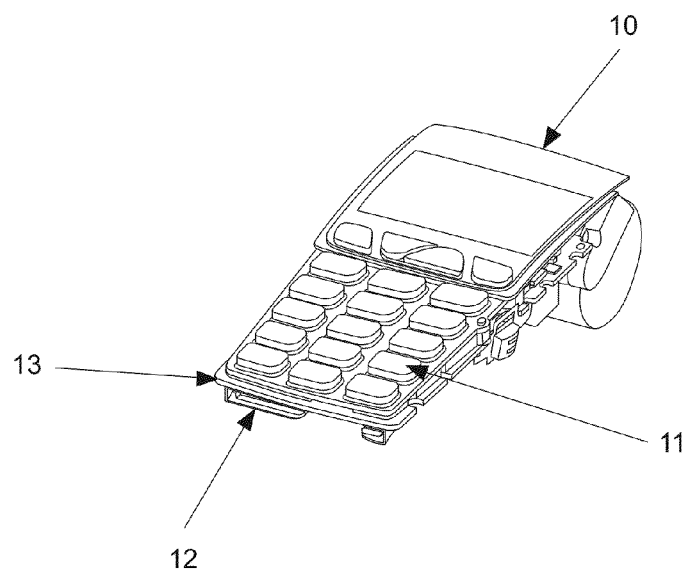
FIG. 1, which has already been discussed, shows an overall view of a payment terminal incorporating a memory card reader.
Figure 2:
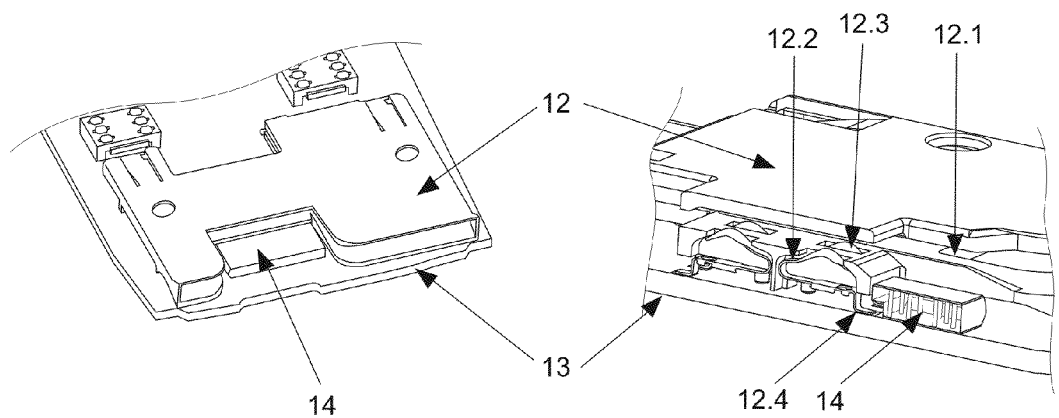
FIG. 2 shows a memory card reader according to an embodiment of the disclosure.

As shown in FIG. 2, the memory card connector 12 is mounted on the printed circuit 13. The memory card connector has a slot 12.1 into which the card can be inserted. The memory card connector likewise includes a set of contacts 12.2 enabling the card to be connected with a processor of the apparatus, once it has been inserted.

These contacts 12.2 have a slight bulge 12.3 in the area of connection with the card inside the memory card connector. The contacts are then shaped so as to extend towards the printed circuit 13. They establish contact with the printer circuit in the vicinity of an intermediate region in which the contact points 12.4 are connected to the printed circuit 13.

The anti-intrusion device 14 is mounted such that it prevents access to at least certain contact points and, in particular, to the "IO" contact.

Figure 3:
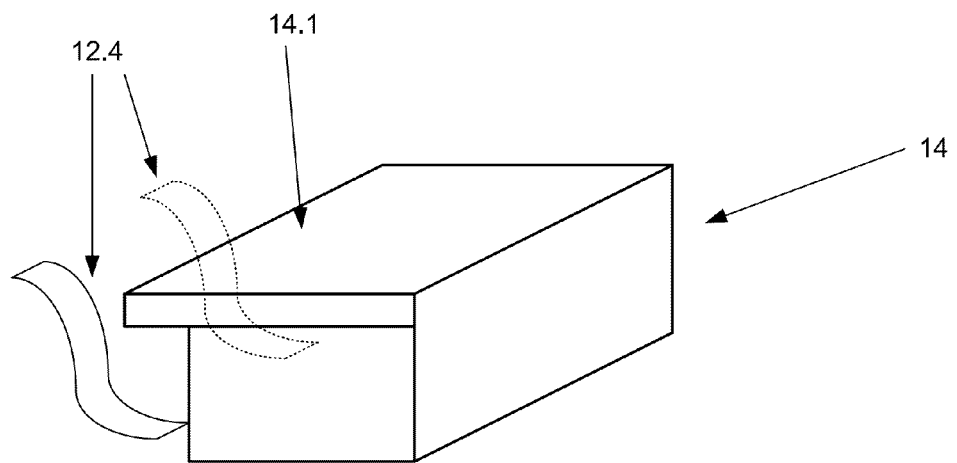
FIG. 3 describes an anti-intrusion device according to an embodiment of the disclosure.

In order to protect against access to the contact points via the upper face of the anti-intrusion device 14 which can advantageously include an obstructing protuberance 14.1, which is an element the width or length of which is greater than the width or length, respectively, of the body of the anti-intrusion device, and which serves to mask the contact points 12.4 of the memory card connector, as shown in FIG. 3.

It is therefore impossible to shift from contact elements (such as thin electric wires or thin conductive films) to the contact elements of the memory card connector in order to eavesdrop on the signals exchanged between the memory card and the processor.

In order to protect the anti-intrusion device from being drilled through with a view to reaching the contact points, the anti-intrusion device includes at least one three-dimensional conducting circuit and at least two elements enabling contact of the three-dimensional conducting circuit with a connector area of the anti-intrusion device on the printed circuit. More particularly, the anti-intrusion device is referred to as a mesh, since the conducting circuit that it contains produces a three-dimensional grid of the volume of the anti-intrusion device.

According to an embodiment of the disclosure, such a grid is produced by positioning several layers of printed circuit one over the other, in accordance with conventional technologies, so as to form an anti-intrusion device, the volume of which enables the access to the contact points to be protected.

In order to enable the membrane tracks to come into contact and to thereby form a true three-dimensional circuit, embedded vias are made between two successive layers. For the record, a via is a plated-through hole which is intended to electrically connect various layers of the printed circuit.

In this way, the architecture of a three-dimensional circuit is such that it is not possible to drill through it without causing a short circuit and triggering active protection of the apparatus, according to an embodiment of the disclosure, namely permanent erasing of the memories containing sensitive information, for example, whether these memories are situated on the apparatus itself or on the card which is inserted therein.

Once formed, the anti-intrusion device can likewise be once again covered with a membrane and thereby comprise a surface-mounted component which itself incorporates a surface-mounted component.

Figure 4:
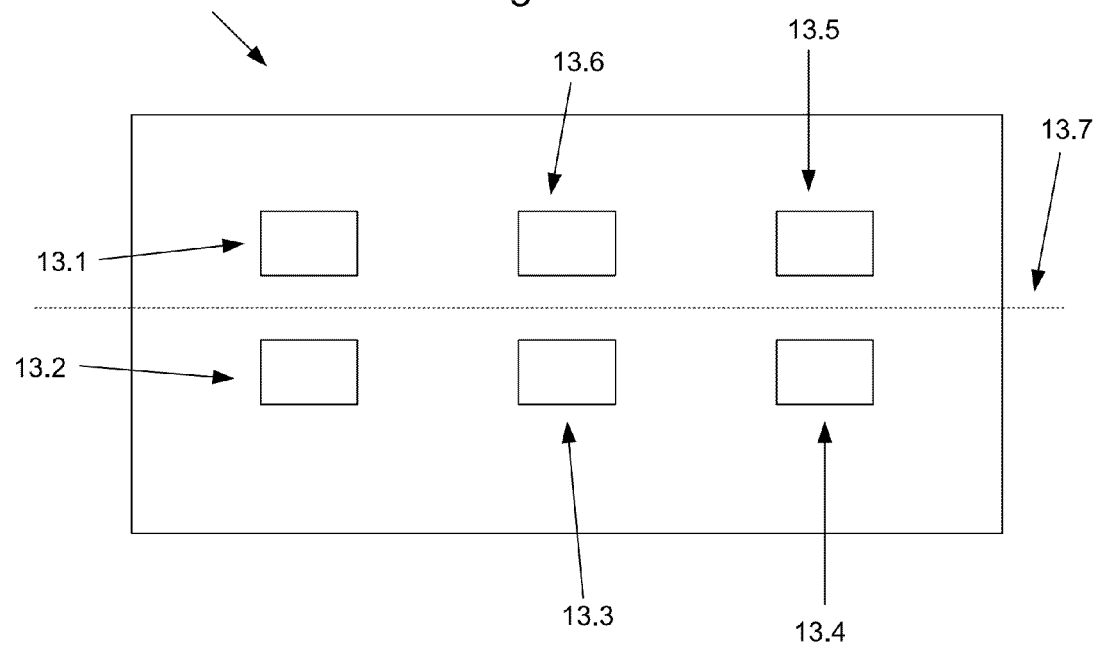
FIG. 4 describes a printed circuit including attachment areas according to an embodiment of the disclosure.

According to an embodiment of the disclosure, and as shown in FIG. 4, the anti-intrusion device 14 is mounted on the printed circuit 13. To accomplish this, as is customary, the printed circuit has areas 13.1 to 13.6 which enable contact between the conducting circuit or circuits of the anti-intrusion device and the circuit or circuits of the printed circuit. However, according to an embodiment of the disclosure, in the mounting region of the anti-intrusion device, the printed circuit has an even number of contact areas, the areas being arranged symmetrically along an imaginary positioning axis 13.7.

The inventors have indeed observed that, during attachment of the surface-mounted components on the printed circuit, lateral force is exerted on the surface-mounted component, which causes the rotation thereof. The inventors discovered that one of the variables which determines the degree of rotation of the surface-mounted component, once attached, relative to the mounting position of this same component, is the number of attachment areas and their positions relative to one another. The inventors thus discovered that, once mounted, and during the action of the fixing agents, the component has a tendency to assume a symmetrical position relative to the attachment areas.

Within the scope of an exemplary embodiment of the disclosure, it is important for the position in which the anti-intrusion device is attached to be the position in which the anti-intrusion device is mounted. Indeed, if, once attached, the anti-intrusion device is angled, even if by only a few degrees relative to the mounting position thereof, the protection action of same may be reduced or even completely cancelled out.

The inventors therefore had the idea of installing an even number of attachment areas for the anti-intrusion device, these areas being distributed symmetrically along a positioning axis. In this way, the forces exerted during the attachment operation are identical over all of the areas and the component is attached in the same position as that in which it was mounted.

Following tests, the inventors likewise observed that the phase of attaching the anti-intrusion device onto the printed circuit could result in the formation of minuscule air pockets in the solder. Such being the case, such pockets are unacceptable with respect to protecting the points of contact. As a matter of fact, if an air pocket is formed during soldering, it might be possible to insert a miniscule electrode therein, by drilling, without causing a short circuit, and without consequently implementing the securement procedures for the apparatus. In addition, these air pockets are very harmful to mechanical strength, and may even create false welds.

Figure 5:
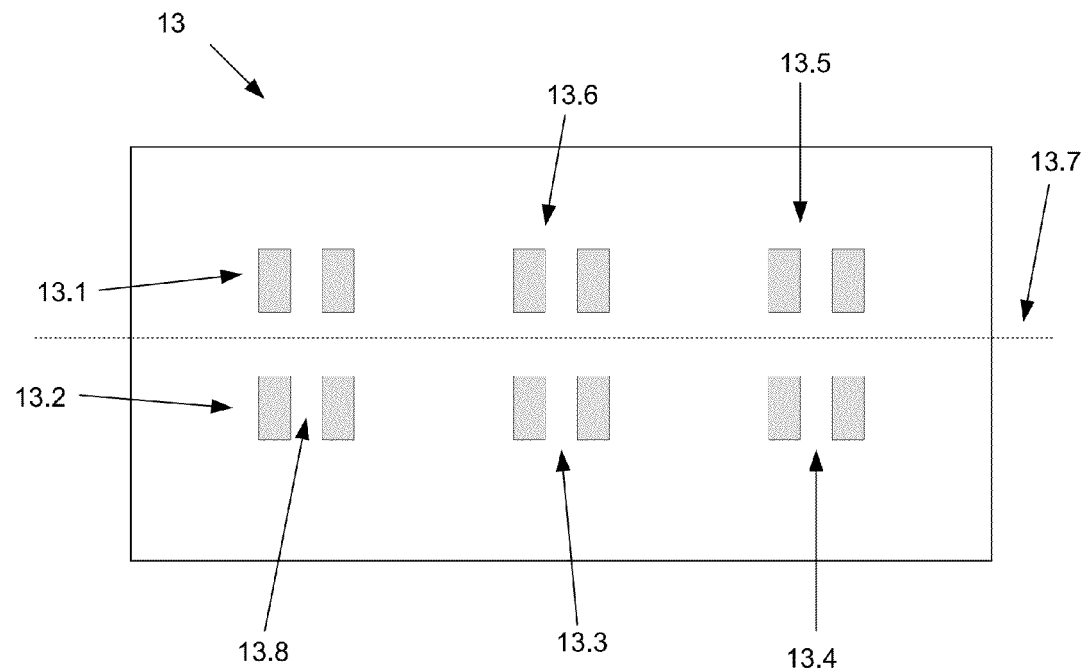
FIG. 5 describes an attachment area according to an embodiment of the disclosure.

Thus, according to an embodiment of the disclosure, and in connection with FIG. 5, the receiving areas 13.1 to 13.6 have been separated by a space 13.8 which does not contain any copper. For this reason, the space left free on the area enables the air resulting from the attachment operation to be accommodated and a weld to be provided which is completely devoid of any air pocket. Guard tracks are likewise positioned around each weld 13.1 to 13.6. Guard tracks make it possible to prevent short-circuiting of the points of contact by producing a lateral attack. These guard tracks are in the shape of a rectangle, which surrounds the receiving areas, and are electrically connected to the secure processor so that the latter can detect a short circuit.

Although the present disclosure has been described with reference to one or more examples, workers skilled in the art will recognize that changes may be made in form and detail without departing from the scope of the disclosure and/or the appended claims.

What is claimed is:

1. A memory card reader comprising:
a printed circuit on which a memory card connector is mounted, said memory card connector having a slot configured for inserting a memory card and a set of contact points enabling data exchange between said memory card and a processor mounted on said printed circuit, wherein said printed circuit is further equipped with an anti-intrusion device formed and fixed thereto such that said anti-intrusion device prevents access, from the exterior of said reader, to at least one connection portion between at least one of said contact points of said set of contact points and said printed circuit, said anti-intrusion device comprising several superimposed layers of printed circuit which are interconnected by embedded vias;

wherein said anti-intrusion device comprises at least two contact elements enabling contact of a conducting circuit with a connector area for said anti-intrusion device on said printed circuit, said connector area comprising at least one contact area; and wherein said contact area comprises at least two separate portions, while, during attachment of said anti-intrusion device onto said printed circuit, a space enables air resulting from said attachment to be discharged.

2. The memory card reader of claim 1, wherein said anti-intrusion device is substantially in the shape of a rectangular parallelepiped which, on an upper face thereof, comprises a protuberance obstructing access to said contact points via a top of said anti-intrusion device.

3. The memory card reader of claim 1, wherein said anti-intrusion device includes at least one three-dimensional conducting circuit.

4. The memory card reader of claim 1, wherein said printed circuit includes a region intended to receive said anti-intrusion device, which includes an even number of connector areas of said anti-intrusion device.

5. A PIN code inputting device, which comprises a memory card reader of claim 1.

6. An anti-intrusion device, in particular for a memory card reader having a printed circuit on which a memory card connector is mounted, said memory card connector having a slot configured for inserting a memory card and a set of contact points enabling data exchange between said memory card and a processor mounted on said printed circuit, wherein the anti-intrusion device comprises:

a shape such that, when fixed on the printed circuit of said card reader, said anti-intrusion device prevents access, from the exterior of said reader, to at least one connection portion between at least one of said contact points of said set of contact points and said printed circuit; and at least two contact elements for connecting to a connector area of said printed circuit, said connector area comprising at least one contact area; said at least two contact elements enabling contact of a conducting circuit with the connector area, wherein said contact area comprises at least two separate portions, while, during attachment of said anti-intrusion device onto said printed circuit, a space between the separate portions enables air resulting from said attachment to be discharged;

several superimposed layers of printed circuit which are interconnected by embedded vias, and which form an electronic component capable of being electrically connected to the printed circuit on which it is fixed.

7. A method of securing an electronic component attached to a printed circuit on which a memory card connector is mounted, said memory card connector having a slot configured for inserting a memory card and a set of contact points enabling data exchange between said memory card and a processor mounted on said printed circuit, wherein the method comprises:

attaching an anti-intrusion device to said printed circuit, which has a shape and attachment to the printed circuit such that said anti-intrusion device prevents access, from an exterior of said reader, to at least one connection portion between at least one of said contact points of said set of contact points and said printed circuit, the anti-intrusion device comprising several superimposed layers of printed circuit which are interconnected by embedded vias, and are capable of being electrically connected to the printed circuit on which it is attached;

wherein said anti-intrusion device comprises at least two contact elements enabling contact of a conducting circuit with a connector area of said anti-intrusion device on said printed circuit, said connector area comprising at least one contact area; and wherein said at least contact area comprises at least two separate portions, while, during said step of attaching of said anti-intrusion device onto said printed circuit, a space enables air resulting from said attachment to be discharged.

* * * * *